United States Patent
Ren et al.

(10) Patent No.: US 12,299,365 B2
(45) Date of Patent: May 13, 2025

(54) METHOD FOR DETERMINING RELATIVE ENERGY BETWEEN SYSTEMS, AND ELECTRONIC DEVICE

(71) Applicant: Beijing Youzhuju Network Technology Co., Ltd., Beijing (CN)

(72) Inventors: Weiluo Ren, Beijing (CN); Weizhong Fu, Beijing (CN); Ji Chen, Beijing (CN)

(73) Assignee: BEIJING YOUZHUJU NETWORK TECHNOLOGY CO. LTD., Beijing (CN)

( * ) Notice: Subject to any disclaimer, the term of this patent is extended or adjusted under 35 U.S.C. 154(b) by 0 days.

(21) Appl. No.: 18/774,674

(22) Filed: Jul. 16, 2024

(65) Prior Publication Data

US 2025/0028883 A1     Jan. 23, 2025

(30) Foreign Application Priority Data

Jul. 21, 2023    (CN) .......................... 202310907934.2

(51) Int. Cl.
    *G06F 30/27*     (2020.01)
(52) U.S. Cl.
    CPC ................... *G06F 30/27* (2020.01)
(58) Field of Classification Search
    USPC .......................................................... 703/12
    See application file for complete search history.

(56) References Cited

U.S. PATENT DOCUMENTS

2023/0104058 A1*   4/2023   Hopfmueller .......... G06N 10/60
                                                                   714/10

OTHER PUBLICATIONS

Extended European Search Report for European Patent Application No. 24188708.2, mailed on Jan. 23, 2025, 9 pages.
Entwistle et al., "Electronic Excited States in Deep Variational Monte Carlo", Arxiv.Org, Cornell University Library, 201 Olin Library Cornell University Ithaca, NY 14853, Jan. 18, 2023, 20 pages.

* cited by examiner

*Primary Examiner* — Bryce M Aisaka
(74) *Attorney, Agent, or Firm* — Astute IP Law Group

(57) ABSTRACT

The present disclosure relates to a method and apparatus for determining a relative energy between systems, an electronic device, a computer-readable storage medium, and a computer program product. The method includes: for a chemical system, performing a plurality of iteration rounds using a neural network variational Monte Carlo method; acquiring a linear relationship between energy errors and energy variances, which are obtained in the plurality of iteration rounds; determining a first energy error at a position where the energy variance is zero based on the linear relationship; and determining the relative energy between the chemical system and a further system based on the first energy error.

20 Claims, 12 Drawing Sheets

METHOD FOR DETERMINING RELATIVE ENERGY BETWEEN SYSTEMS, AND ELECTRONIC DEVICE

CROSS-REFERENCE TO RELATED APPLICATION

The present application claims the priority to Chinese Patent Application No. 202310907934.2, filed on Jul. 21, 2023, and entitled "METHOD FOR DETERMINING RELATIVE ENERGY BETWEEN SYSTEMS, AND ELECTRONIC DEVICE", which is incorporated in its entirety herein by reference.

FIELD

The present disclosure generally relates to the field of quantum systems, and more particularly to a method and an apparatus for determining a relative energy between systems, an electronic device, a computer-readable storage medium, and a computer program product.

BACKGROUND

Accurately solving a ground-state wave function and energy of a molecular system or a periodic system is one of central problems of quantum chemistry. The simulation of the quantum chemistry of the system helps to solve important scientific or industrial problems, for example, helping to understand the mechanism of abnormal high-temperature superconducting, understand the reaction mechanism of a catalytic process, or physically design an energy storage material, and the like. Generally, ground-state energy depends on a Hamiltonian, so it is further necessary in practical applications to further determine the relative energy between two systems that have actual physical meanings.

Quantum Monte Carlo method is a kind of high-accuracy method for researching complex quantum systems, this kind of method may provide a precise and reliable solution for quantum multi-body problems (e.g., solving an electronic structure), wherein a variational Monte Carlo method is one of the most commonly used methods. However, the currently used variational Monte Carlo method has the problems of low calculation accuracy, a large calculation amount, etc.

SUMMARY

According to exemplary embodiments of the present disclosure, provided is a solution for determining the relative energy between systems, in which via considering a linear relationship between energy errors and energy variances, and performing variance extrapolation on energy, an energy error of a corresponding system at a position where the energy variance is zero is obtained, so that the relative energy can be determined more quickly and efficiently.

In a first aspect of the present disclosure, provided is a method for determining the relative energy between systems, including: for a chemical system, performing a plurality of iteration rounds using a neural network variational Monte Carlo method; acquiring a linear relationship between energy errors and energy variances, which are obtained in the plurality of iteration rounds; determining a first energy error at a position where the energy variance is zero based on the linear relationship; and determining the relative energy between the chemical system and a further system based on the first energy error.

In a second aspect of the present disclosure, provided is an electronic device, including: at least one processing unit; and at least one memory, coupled to the at least one processing unit and storing an instruction executed by the at least one processing unit, wherein the instruction, when executed by the at least one processing unit, causes the electronic device to execute the method described according to the first aspect of the present disclosure.

In a third aspect of the present disclosure, provided is an apparatus for determining the relative energy between systems, including: an iteration unit, configured to: for a chemical system, perform a plurality of iteration rounds using a neural network variational Monte Carlo method; a linearity determination unit, configured to acquire a linear relationship between energy errors and energy variances, which are obtained in the plurality of iteration rounds; an energy error determination unit, configured to determine a first energy error at a position where the energy variance is zero based on the linear relationship; and a relative energy determination unit, configured to determine the relative energy between the chemical system and a further system based on the first energy error.

In a fourth aspect of the present disclosure, provided is a computer-readable storage medium, having a machine-executable instruction stored thereon, wherein the machine-executable instruction, when executed by a device, causes the device to execute the method described according to the first aspect of the present disclosure.

In a fifth aspect of the present disclosure, provided is a computer program product, including a computer-executable instruction, wherein the computer-executable instruction, when executed by a processor, implements the method described according to the first aspect of the present disclosure.

In a sixth aspect of the present disclosure, provided is an electronic device, including: a processing circuit, configured to execute the method described according to the first aspect of the present disclosure.

The Summary is provided to introduce a series of concepts in a simplified form, and these concepts will be further described below in the Detailed Description of Embodiments. The Summary is not intended to identify key features or essential features of the present disclosure, nor is it intended to limit the scope of the present disclosure. Other features of the present disclosure will become readily understood via the following description.

BRIEF DESCRIPTION OF THE DRAWINGS

The above and other features, advantages and aspects of various embodiments of the present disclosure will become more apparent in combination with the drawings and with reference to the following detailed description. In the drawings, the same or similar reference signs denote the same or similar elements, wherein.

DETAILED DESCRIPTION OF EMBODIMENTS

Figure 1A:
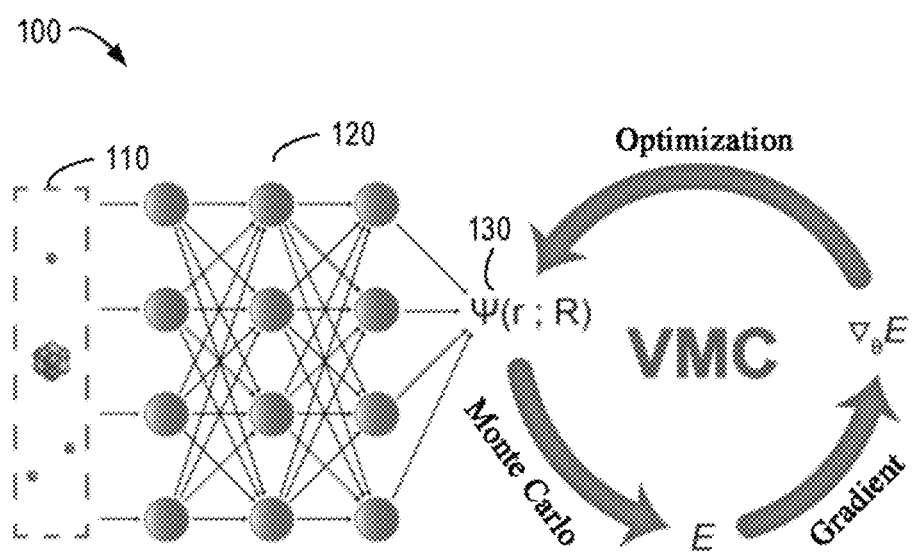
FIG. 1A illustrates a schematic diagram of a neural network variational Monte Carlo method.

Hereinafter, embodiments of the present disclosure will be described in more detail with reference to the drawings. Although some embodiments of the present disclosure have been illustrated in the drawings, it should be understood that the present disclosure may be implemented in various forms and should not be construed as being limited to the embodiments set forth herein; and rather, these embodiments are provided to help understand the present disclosure more thoroughly and completely. It should be understood that the drawings and embodiments of the present disclosure are for exemplary purposes only and are not intended to limit the protection scope of the present disclosure.

Hereinafter, some basic quantum terms that may be involved in embodiments of the present disclosure are first described with reference to Table 1.

TABLE 1

| No. | Term | Description |
|---|---|---|
| 1 | Microscopic | Represent an atomic size scale in the present disclosure. |
| 2 | Chemical system | Refer to a molecule formed by some single atoms or a plurality of atoms in a particular configuration. |
| 3 | Ground state | A state in which the energy of a chemical system in quantum chemistry is the minimum. |

TABLE 1-continued

| No. | Term | Description |
|---|---|---|
| 4 | Wave function | A function used for describing the state of a microscopic system. It may represent a wave function of an electron in the present disclosure. For example, an input is spatial coordinates of the electron, and a norm of an output is proportional to a probability of the electron appearing at the location. |
| 5 | Hamiltonian | Used for describing the energy of the microscopic system, and may be expressed as a Hermitian operator of the energy of a quantum system. For example, it denotes an operator (e.g., derivation, and the like) on the wave function in the present disclosure. |
| 6 | Wave function ansatz | Used for representing a parameter-containing function model of the wave function. |
| 7 | Monte Carlo method | A classical method for sampling a given distribution, which may calculate an expectation and an integral. |
| 8 | Variational Monte Carlo method | A quantum chemical method for calculating the ground-state energy of the chemical system by using the variational principle and the Monte Carlo method. |
| 9 | Walker | A sample point used for sampling in various Monte Carlo methods. |
| 10 | Local energy | A physical quantity defined on the spatial coordinates of the electron, and may be used for calculating overall energy in the Monte Carlo method |
| 11 | Energy variance | An expectation value of energy fluctuation, wherein the variance of local energy is calculating by using the Monte Carlo method during actual calculation |
| 12 | Training data | Energy data in a training process, including energy, an energy variance and the like, wherein the training data is obtained only by using a batch of walkers in the training process, so that the error is relatively large. |
| 13 | Detection point | Record an intermediate running state of software, and used for recovering a corresponding calculation state when the calculation is interrupted or restarted. |
| 14 | Detection data | Energy data obtained by detecting a certain detection point via a plurality of batches of walkers, including energy, an energy variance and the like, and the error is relatively small. |
| 15 | Fermionic neural network | One of neural networks in the current quantum chemistry, and is used for a molecular system. |
| 16 | Deep solid neural network | One of neural networks in the current quantum chemistry, and is used for a periodic system. |

In embodiments of the present disclosure, the term "chemical system" may also be referred to as a chemistry system, or may be referred to as a system for short, for example, the chemical system may include a molecular system and a periodic system. Exemplarily, the molecular system may also be referred to as a molecule system, and the periodic system may be referred to as a periodical system, a solid system, a material system, or the like, which is not limited in the present disclosure.

Only a few problems may be strictly solved in the quantum mechanics, e.g., a resonator, a hydrogen atom, a square potential well, and the like, and the vast majority of problems either have no strict solutions or require some degrees of approximate solutions through other means, e.g., a perturbation theory method. In addition to analytical methods, many numerical methods have been developed to deal with most quantum problems, for example, a quantum Monte Carlo method is one of the methods used for studying more complex quantum systems, among which a variational Monte Carlo method is the most commonly used.

The basic idea of the variational Monte Carlo method is to construct a parameter-containing function model for expressing a multi-body electron wave function at first, that is, a wave function ansatz, and then continuously optimize the wave function ansatz towards an energy reduction direction based on the idea of the variational method until convergence. Obviously, the accuracy of the variational Monte Carlo method is limited by the expression capability of the wave function ansatz. A neural network model developed rapidly in recent years is a function model with very powerful expression capability, and a "Fermionic neural network (FermiNet)" and a "deep solid neural network (DeepSolid)" are wave function ansatzs constructed based on the neural network model, and greatly improve the accuracy of the variational Monte Carlo method.

The combination of the variational Monte Carlo method and the neural network is successful in accuracy, but the cost is a huge calculation amount. In addition, the convergence problem of neural network training results in worse error cancellation capability, and the accuracy of calculating relative energy is not satisfactory.

In order to solve the above and other potential issues, embodiments of the present disclosure provide a solution for determining the relative energy between systems. In the solution, a plurality of iteration rounds are performed using a neural network variational Monte Carlo method, so that a linear relationship between energy errors and energy variances can be obtained when no convergence is achieved, and an energy error at a position where the energy variance is zero is determined based on the linear relationship, so that the relative energy can be determined on this basis. It can be seen that, since there is no need to wait for complete convergence of training in the solution, the required time is less, and the efficiency is high. In addition, since a ground-state wave function serving as an eigenstate should have the property that the energy variance is zero, a relative error is determined based on the energy error when the energy variance is zero in the present solution, so that the accuracy is higher.

FIG. 1A illustrates a schematic diagram of a neural network variational Monte Carlo method 100. As shown in FIG. 1A, for a chemical system (e.g., a molecular system or a periodic system) 110, a wave function ansatz 130 may be constructed using a neural network architecture 120. Exemplarily, the wave function ansatz 130 may be used for representing a multi-body electron wave function.

As shown in FIG. 1A, on the basis of the constructed wave function ansatz 130 (a trial wave function), optimization is performed by using the ideas of a variational method and via a relationship among a wave function, an energy and an energy gradient. Exemplarily, in FIG. 1A, $\Psi(r; R)$ denotes the wave function, E denotes the energy, and $\nabla_\theta E$ denotes the energy gradient. Specifically, optimization may be performed towards an energy reduction direction until convergence is achieved, for example, the wave function may be optimized based on the minimization of an energy expectation value of the wave function ansatz. Then, a converged wave function (i.e., a ground-state wave function) and energy (i.e., ground-state energy) may be obtained. Exemplarily, a high-dimensional integral involved in the optimization process may be calculated by using a Monte Carlo method.

Figure 1B:
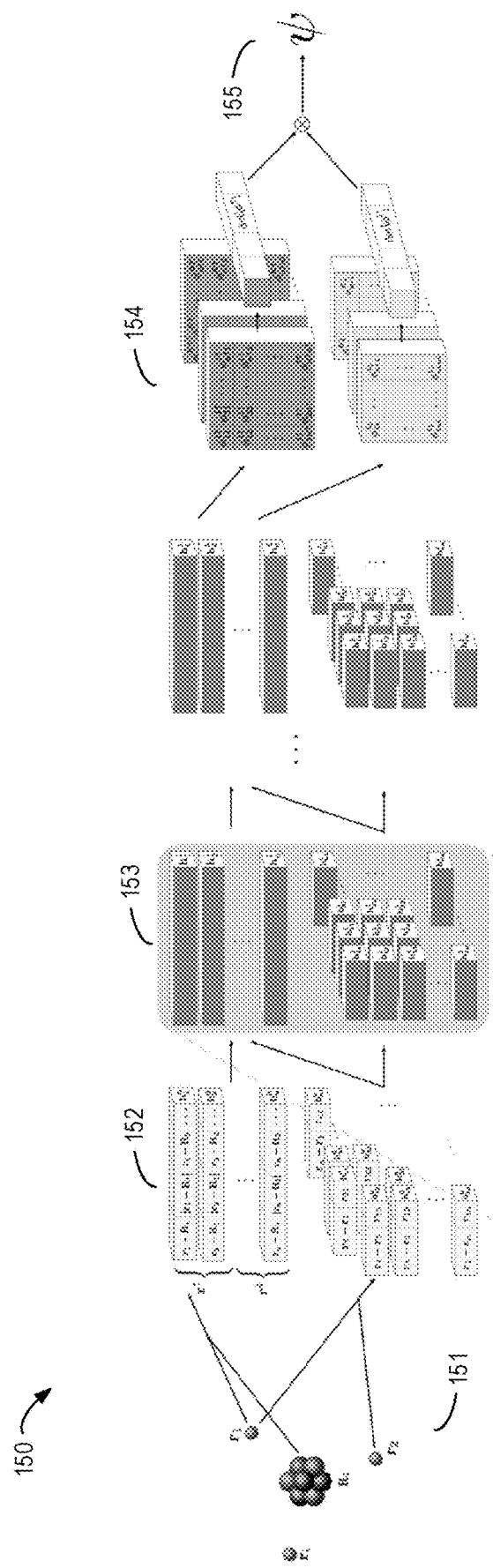
FIG. 1B illustrates a schematic diagram of a Fermionic neural network.

Exemplarily, the neural network architecture 120 for the molecular system may be a Fermionic neural network; and the neural network architecture 120 for the periodic system may be a deep solid neural network. FIG. 1B illustrates a schematic diagram of a Fermionic neural network 150, and FIG. 1C illustrates a schematic diagram of a deep solid neural network 160.

As shown in FIG. 1B, the wave function ansatz of the molecular system may be obtained based on the Fermionic neural network. Specifically, features 151 of one or more electron positions of the molecular system are input into different streams 152 of the Fermionic neural network. These features are converted by a plurality of layers 153, and a determinant 154 is further applied, to obtain an output of the Fermionic neural network, i.e., a wave function ansatz 155 of the molecular system.

Figure 1C:
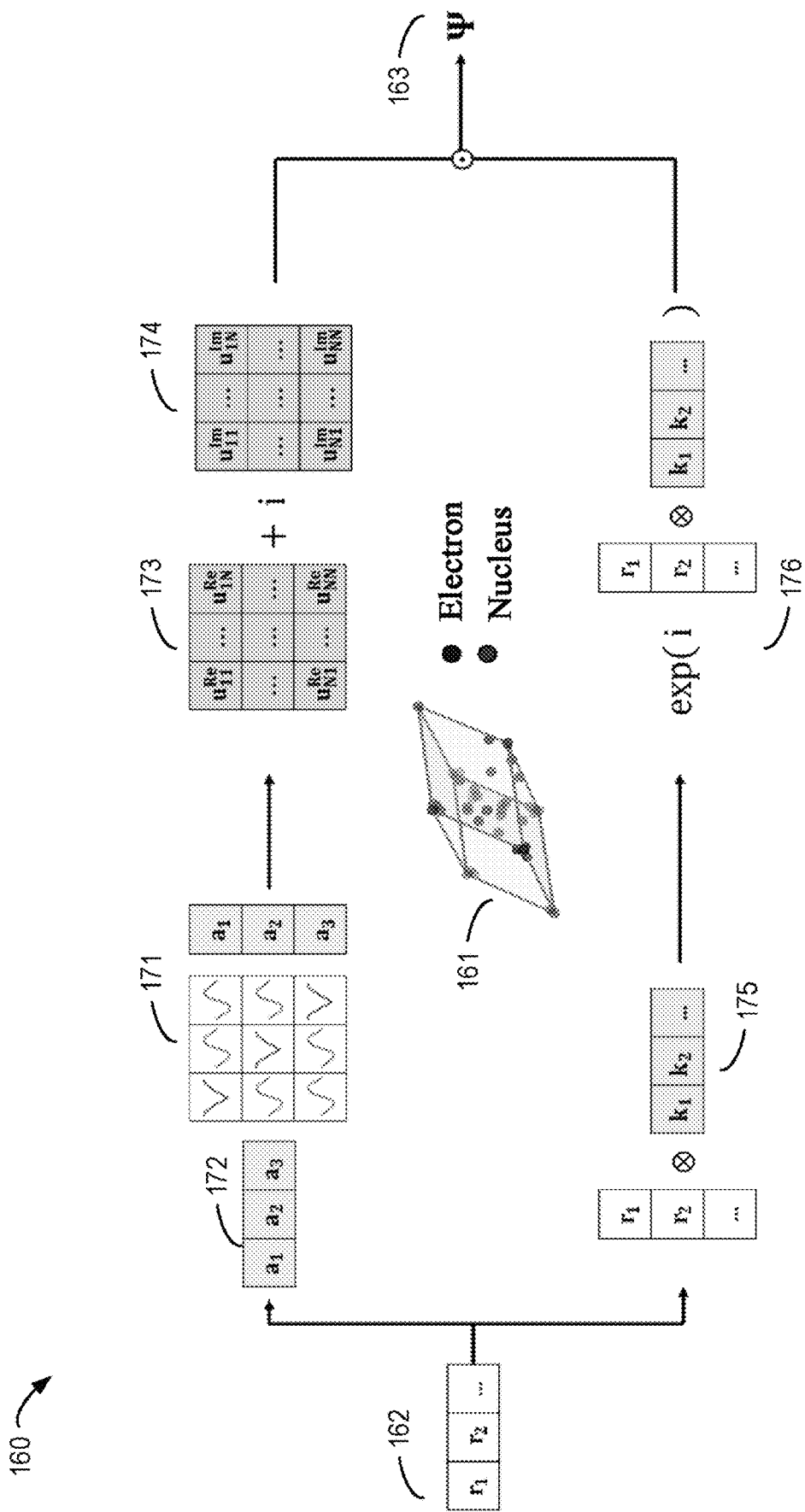
FIG. 1C illustrates a schematic diagram of a deep solid neural network.

As shown in FIG. 1C, the wave function ansatz of the periodic system may be obtained based on the deep solid neural network. Specifically, a primitive cell 161 (i.e., a periodic unit) of the periodic system includes a plurality of nuclei and a plurality of electrons. The input of the deep solid neural network is electron coordinates 162 of the primitive cell 161, and an output of the neural network is a wave function ansatz 163 of the primitive cell 161.

Periodicity and anti-symmetry are two fundamental properties of the wave function of the solid system. The anti-symmetry may be ensured by the Slater determinants. embodiments of the present disclosure, the deep solid neural network may include two channels, so that the wave function may be denoted by two Slater determinants of one spin-up channel and one spin-down channel.

Specifically, the electron coordinates 162 may be input into the two channels. In the first channel, a periodic distance feature is constructed by using a periodic metric matrix 171 and a lattice vector 172, and then the periodic distance feature is fed into two molecular neural networks 173 and 174, so as to obtain a real part and an imaginary part of the wave function, respectively. In the second channel, a plane-wave phase factor 176 may be constructed on a selected subset of crystal momentum vectors 175. Further, combination may be performed based on the outputs of the two channels, so as to obtain the output of the neural network, i.e., the wave function ansatz 163.

Figure 2:
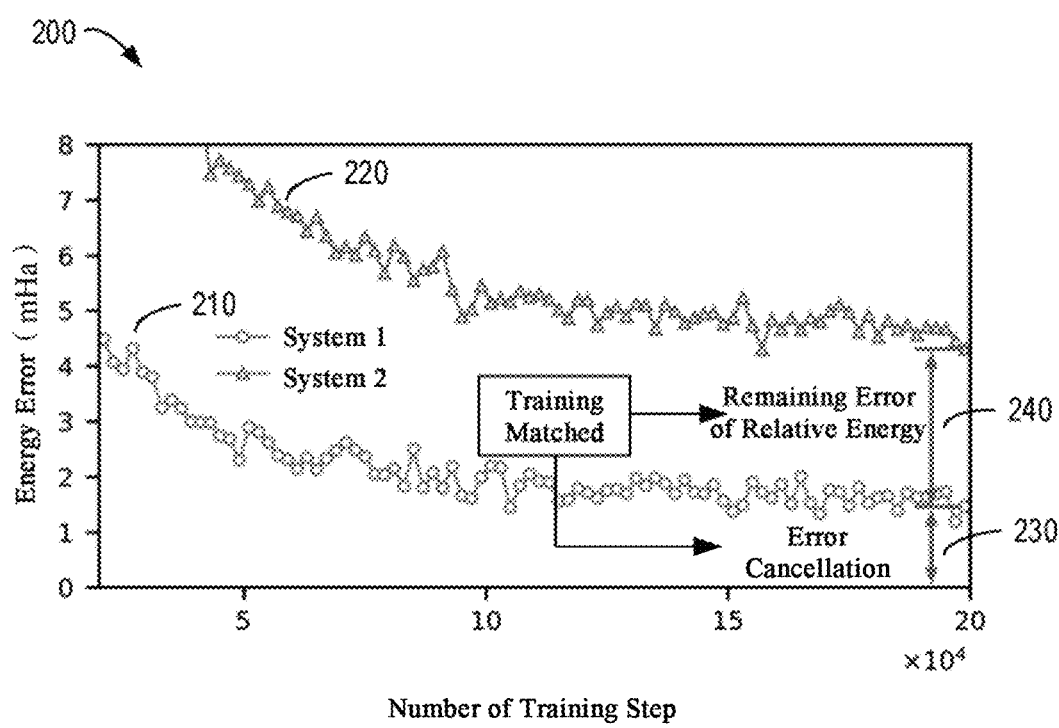
FIG. 2 illustrates a schematic curve chart of determining a relative energy based on a neural network variational Monte Carlo method in the prior art.

FIG. 2 illustrates a schematic curve chart of determining relative energy 200 based on a neural network variational Monte Carlo method in the prior art. As shown in FIG. 2, the horizontal axis denotes a number of training step in a training process; and the vertical axis denotes an energy error, which is in units of mHa. Specifically, curve charts of two different systems are shown in FIG. 2, including a curve 210 of system 1 and a curve 220 of system 2.

In existing solutions, in order to calculate the relative energy, the two different systems (the system 1 and the system 2) use networks with the same size, and a same number of training rounds is performed, for example, the training rounds in FIG. 2 are 200,000 ($20 \times 10^4$) rounds.

As shown in a "training matched (TM)" manner in FIG. 2, via a policy for calculating the relative energy, an energy error 230 of the smaller system in the two systems is an energy error amount that is finally canceled, and relative energy 240 is a difference value between the final energy errors of the two systems (the system 2 and the system 1). Exemplarily, the final relative energy is a difference value between energy errors obtained after the same number of iteration rounds (such as 200,000 in FIG. 2).

However, it can be understood that, since the same number of training rounds cannot ensure that the energy convergence degrees of different systems are the same, and the energy errors obtained by using the same network to process systems of different difficulty levels also have a relatively large difference, the error obtained by using the above policy is still relatively large. As can be seen from FIG. 2, an error 240 of the obtained relative energy is relatively large.

Exemplarily, the solution of determining the relative energy based on the solution of FIG. 2 (i.e., the difference value between the energy errors after the same number of training rounds) may be referred to as a TM solution for short, the solution of obtaining the relative energy by using the variational Monte Carlo method of the Fermionic neural network is referred to as Fermi-TM, and the solution of obtaining the relative energy by using the variational Monte Carlo method of the deep solid neural network is referred to as DeepSolid-TM.

Figure 3:
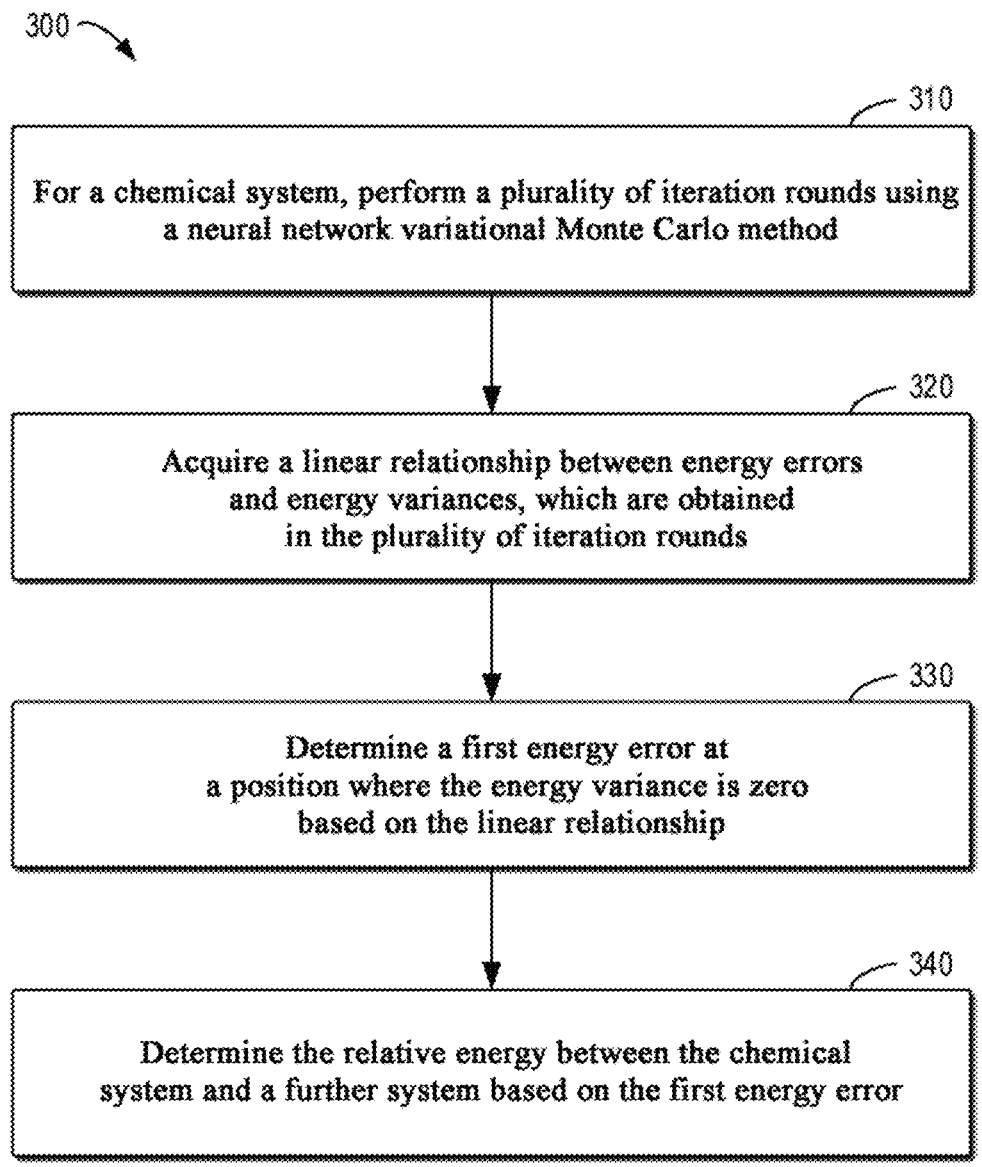
FIG. 3 illustrates a schematic flowchart of a process of determining the relative energy between systems according to embodiments of the present disclosure.

FIG. 3 illustrates a schematic flowchart of a process 300 of determining the relative energy between systems according to embodiments of the present disclosure. In block 310, for a chemical system, a plurality of iteration rounds are performed using a neural network variational Monte Carlo method. In block 320, a linear relationship between energy errors and energy variances, which are obtained in the plurality of iteration rounds, is acquired. In block 330, a first energy error at a position where the energy variance is zero is obtained based on the linear relationship. In block 340, the relative energy between the chemical system and a further system is determined based on the first energy error.

It can be understood that, the chemical system in embodiments of the present disclosure may be a molecular system or a periodic system. Exemplarily, the periodic system may be a one-dimensional periodic system, a two-dimensional periodic system, or a three-dimensional periodic system, which is not limited in the present disclosure. Exemplarily, the molecular system may be, e.g., a nitrogen molecule. Exemplarily, the periodic system may be, e.g., a one-dimensional periodic hydrogen chain system, a two-dimensional periodic graphene system, a two-dimensional single-layer boron nitride (2D-BN) system, a three-dimensional transition metal oxide nickel oxide (3D-NiO) system, a three-dimensional periodic uniform electron gas system, etc.

Specifically, in block 310, a wave function ansatz of the chemical system may be constructed by using a neural network architecture; the energy of the chemical system is determined based on the wave function ansatz by using a Monte Carlo method; an energy gradient is determined based on the energy by using a variational method; and the wave function ansatz and the energy are updated through a plurality of iteration rounds.

In some embodiments, in response to the chemical system being a molecular system, the used neural network architecture may be a Fermionic neural network, and correspondingly, the wave function ansatz is an output of the Fermionic neural network. In some embodiments, in response to the chemical system being a periodic system, the used neural network may be a deep solid neural network, and correspondingly, the wave function ansatz is an output of the deep solid neural network.

In embodiments of the present disclosure, the energy may be determined by using the Monte Carlo method via the following formula (1):

$$E = \Psi^{-1} \hat{H} \Psi \quad (1)$$

In formula (1), E denotes the energy, $\Psi$ denotes the wave function, and H denotes a Hamiltonian. In some embodiments, the energy gradient (e.g., expressed as $\nabla_\theta E$) may be obtained based on the energy by using a variational method, e.g., by calculating the gradient. It can be understood that, the process in block 310 is similar to the process described above with reference to FIG. 1, except that there is no need to wait for convergence in block 310 of the present solution. That is, the subsequent operations of block 320 to block 340 may be executed during the iteration process.

In embodiments of the present disclosure, the plurality of iteration rounds in block 310 may occur at a model training stage (referred to as a training stage for short), and may also occur at a model inference stage (referred to as a detecting stage, an inference stage, or an application stage for short). Specifically, a first number of walkers are sampled at the training stage; and a second number of walkers are sampled at the detecting stage. In general, the second number is much greater than the first number, so that a long training time can be avoided. Exemplarily, an order of magnitudes of the second number is greater than an order of magnitudes of the first number, for example, the order of magnitudes of the first number is one thousand, and the order of magnitudes of the second number is ten thousand, one hundred thousand, or even greater.

Exemplarily, in each round among a process of the plurality of iteration rounds, the local energy per walker may be determined, and then an energy variance may be determined based on the local energy per walker. Exemplarily, in embodiments of the present disclosure, the energy error may be understood as an error between an energy output by the model and a standard answer, for example, the standard answer may be an energy obtained based on an experimental result. Alternatively, exemplarily, in embodiments of the present disclosure, the energy error may be understood as an energy output by the model, that is, the energy error and the energy may be interchanged for use in some scenarios, which is not limited in the present disclosure.

It can be understood that a linear relationship between energy variances and energy errors may be expressed as a fitting straight line in a coordinate system, where the horizontal axis of the coordinate system denotes the energy variances, and the vertical axis denotes the energy errors. Optionally, the linear relationship may be expressed as "energy error=a×energy variance+b", where the coefficients a and b are determined based on the plurality of iteration rounds.

Exemplarily, the fitting straight line may be obtained by fitting a plurality of data points in the coordinate system, where the plurality of data points may correspond to a plurality of pairs of error-variance (error-variance pairs), and each error-variance pair includes one energy variance value (one horizontal axis value) and one energy error value (one vertical axis value).

In some embodiments of the present disclosure, a plurality of energies corresponding to the plurality of iteration rounds may be obtained through the plurality of iteration rounds. Exemplarily, a plurality of error-variance pairs may be determined in block 320 based on the plurality of iteration rounds. For example, one error-variance pair may be determined based on N energy values obtained in every N adjacent iteration rounds. For example, the first error-variance pair is determined based on the first round to the Nth round, the second error-variance pair is determined based on the (N+1)th round to the 2Nth round, . . . . Optionally, the value of N may be 2000. In this way, one data point for determining the linear relationship may be obtained after every 2000 rounds.

Exemplarily, for the N energy values of the N iteration rounds, N0 anomaly values therein may be removed, and a data point corresponding to the N iteration rounds is determined based on an average energy value of the remaining N−N0 energy values. Optionally, a difference between the anomaly value and the average energy value exceeds a threshold percentage, for example, the threshold percentage is 20%, 10% or other values.

Exemplarily, for the plurality of error-variance pairs, the first M error-variance pairs therein may be deleted. That is, for the plurality of data points, the first M data points may be deleted. For example, M may be greater than 6, for example, M is 8 or other values. Exemplarily, the linear relationship between energy errors and energy variances may be determined based on a plurality of remaining error-variance pairs after the deletion operation. In this way, the linear relationship can be determined more quickly.

In some embodiments, via determining the linear relationship, values of a and b in the foregoing expression "energy error=a×energy variance+b" may be determined. In some embodiments, via determining the linear relationship, it is possible to determine the fitting straight line in which the horizontal axis denotes the energy variances and the vertical axis denotes the energy errors in the coordinate system. In this way, the first energy error, e.g. b, may be further determined in block 330.

It can be understood that, according to the quantum mechanics theory, a ground-state wave function serving as an eigenstate should have the property that the energy variance is zero. Therefore, in embodiments of the present disclosure, the energy error can be determined more quickly and accurately by extrapolating the energy variance to the position of 0.

It can be understood that, since the energy variance based on the plurality of iteration rounds is not zero, the first energy error corresponding to the zero energy variance is actually obtained by performing extrapolation based on the linear relationship. Exemplarily, the solution in embodiments of the present disclosure may be referred to as a "variance extrapolation (VE)" method or a VE solution. For example, the solution of obtaining the relative energy by using the variational Monte Carlo method of the Fermionic neural network and via VE is referred to as Fermi-VE, and the solution of obtaining the relative energy by using the variational Monte Carlo method of the deep solid neural network and via VE is referred to as DeepSolid-VE.

In some embodiments, a second energy error corresponding to the zero energy variance of a further system may also be determined, and then the relative energy therebetween may be determined based on the first energy error and the second energy error. For example, an absolute value of a difference value between the first energy error and the second energy error may be used as the relative energy.

Optionally, in some examples, for the further system, the second energy error of the system may be determined by using a method similar to the method of determining the first energy error of the chemical system described above. Optionally, in some other examples, for the further system, a predetermined second energy error may be acquired, for example, may be a theoretical value or an experimental result, which is not limited in the present disclosure.

In some embodiments of the present disclosure, the further system for calculating the relative energy may be referred to as system 1, while the chemical system in block 310 may be referred to as system 2. In some examples, the system 1 may be a system associated with the system 2. For example, each molecule/atom in the system 2 is in a bonding state or an aggregation energy state, while each molecule/ atom in the system 1 is in a non-bonding state. For example, the system 2 is in a transition state, and the system 1 is in a ground state.

Figure 4:
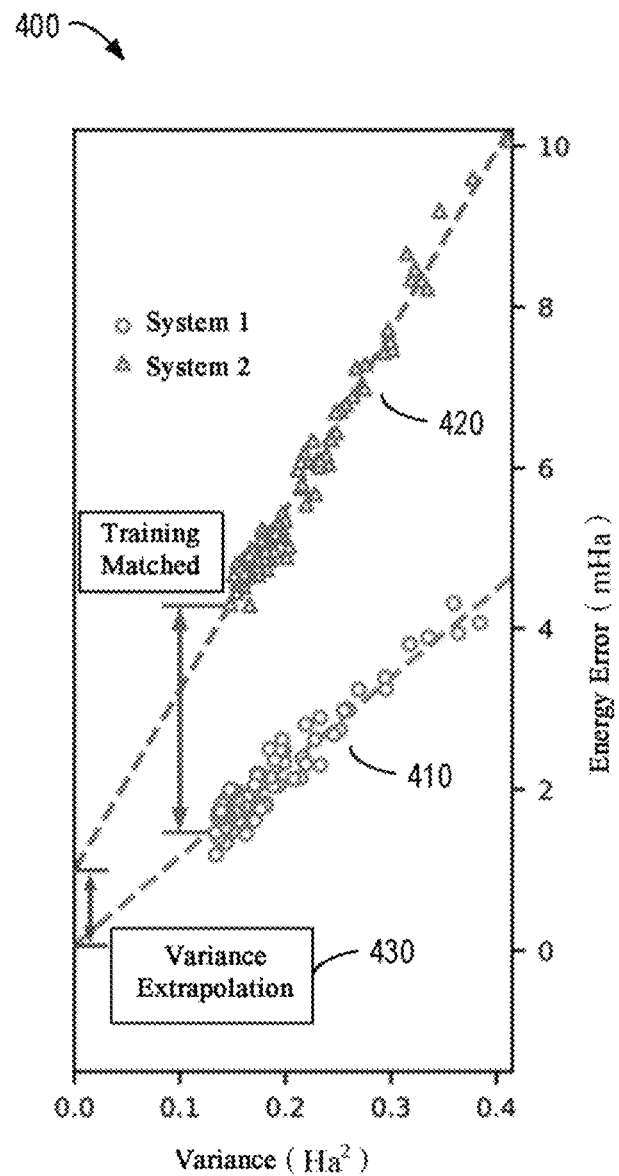
FIG. 4 illustrates a schematic curve chart of a relationship between energy errors and energy variances according to exemplary embodiments of the present disclosure.

FIG. 4 illustrates a schematic curve chart of a relationship 400 between energy errors and energy variances according to exemplary embodiments of the present disclosure. The horizontal axis in FIG. 4 denotes the energy variance, which is in a unit of $Ha^2$; and the vertical axis denotes the energy error, which are in a unit of mHa. Specifically, FIG. 4 illustrates a curve chart 410 of the system 1 and a curve chart 420 of the system 2.

As an example, during the training process, by using the linear relationship (also referred to as linearity) shown by the energy errors and the energy variances, the result of the energy error at the position where the energy variance is 0 may be obtained by linear extrapolation, "variance extrapolation" 430 as shown in FIG. 4, and then the relative energy between the two systems is calculated.

As an example, the result of "training matched" (obtained based on the method in FIG. 2) is also shown in FIG. 4. It can be seen that, the error of the relative energy obtained by the variance extrapolation 430 in the present solution is much smaller than that of the relative energy of the training matched. That is, by using the solution in embodiments of the present disclosure, the error of the relative energy can be significantly reduced.

Figure 5:
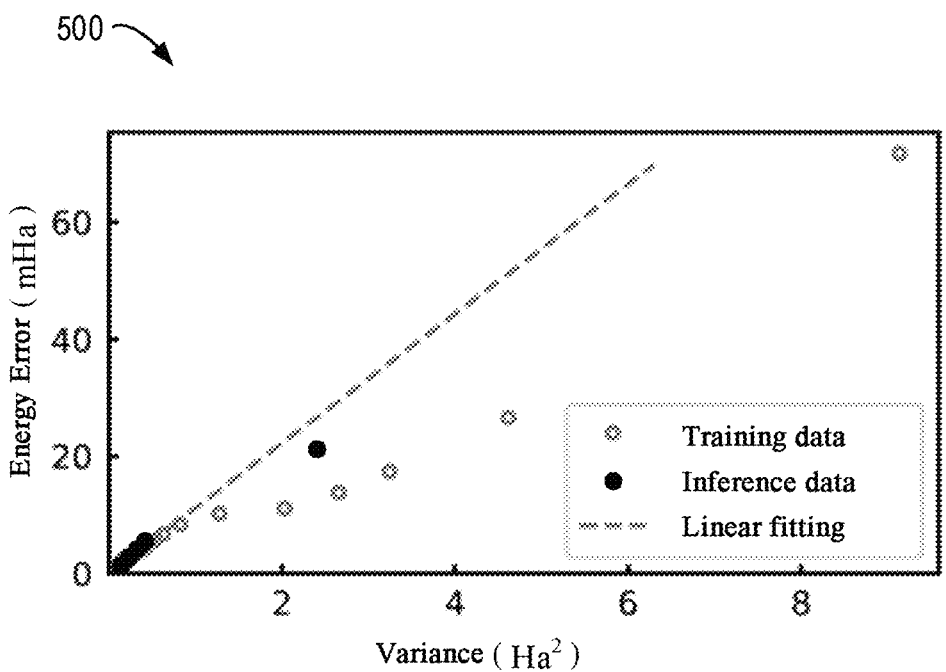
FIG. 5 and FIG. 6 respectively illustrate schematic diagrams of comparison between a training stage and an inference stage according to exemplary embodiments of the present disclosure.
Figure 6:
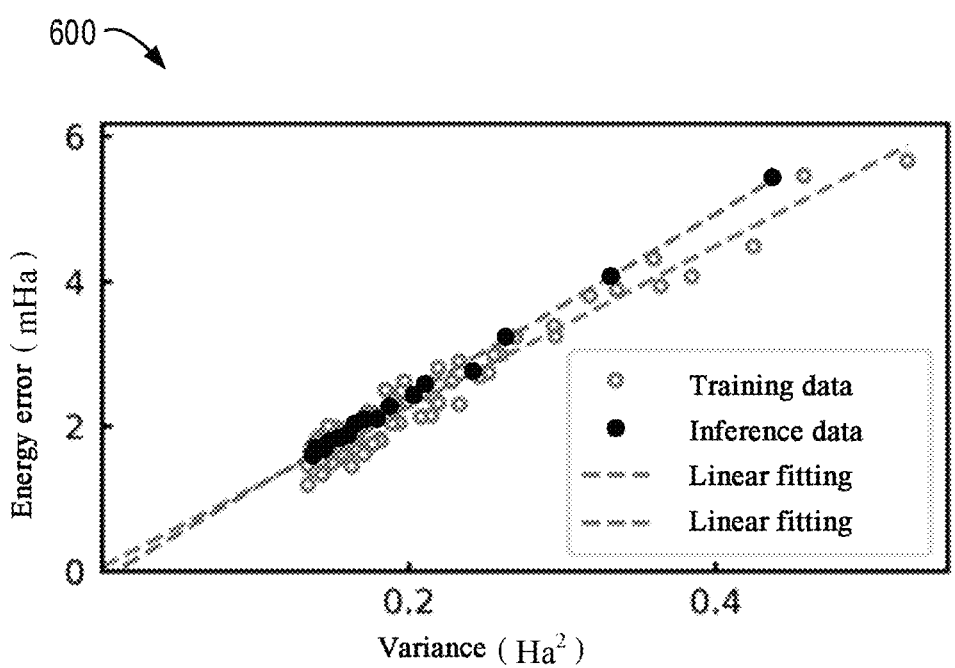

FIGS. 5-6 illustrate schematic diagrams 500 and 600 of comparison between a training stage and an inference stage respectively according to exemplary embodiments of the present disclosure. In each of FIGS. 5-6, the horizontal axis denotes the energy variance, and the vertical axis denotes the energy error. FIGS. 5-6 illustrate comparison of energy errors between training data and inference data (also referred to as detection data), for example, the illustrated inference data is detection data for detection points of every 10,000 steps.

FIG. 5 shows that there is a relatively large difference between the energy errors of the training data and the inference data at an early stage of iteration; and FIG. 6 shows that the difference therebetween is reduced at a later stage of iteration. Since the linearity of the energy errors and the energy variances occurs at the later stage, that is, an applying area of the "variance extrapolation" method, in actual cases, as shown in FIG. 6, after the "variance extrapolation" method is used for both the training data and the inference data, the difference therebetween may be neglected. Therefore, in embodiments of the present disclosure, variance extrapolation is applied based on the training data, and the result is also reasonable and reliable for the inference data.

Figure 7:
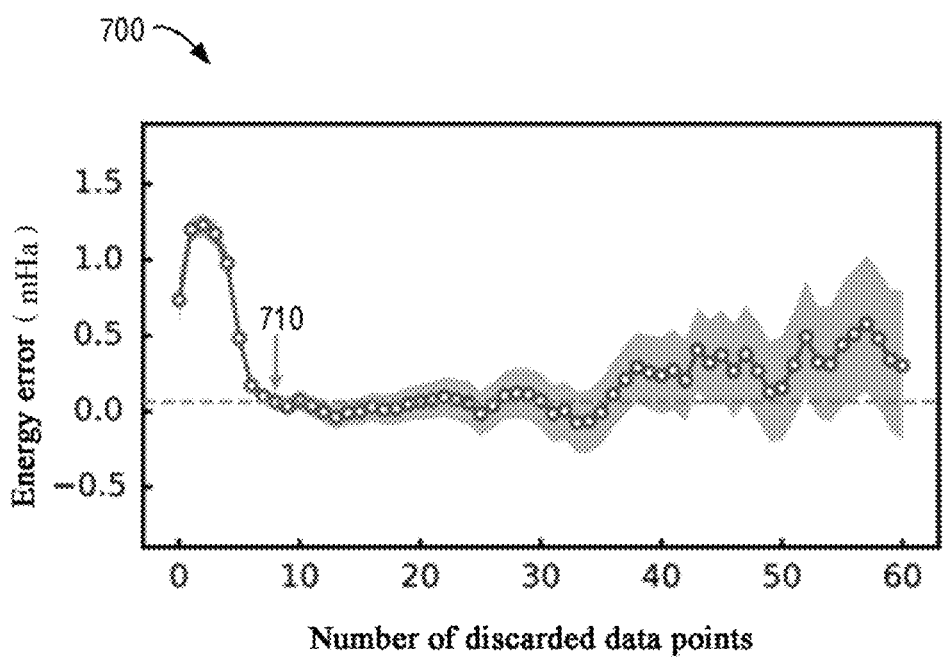
FIGS. 7-8 illustrate schematic diagrams of an energy error and a fitting correlation coefficient for the number of discarded data points, respectively, according to exemplary embodiments of the present disclosure.
Figure 8:
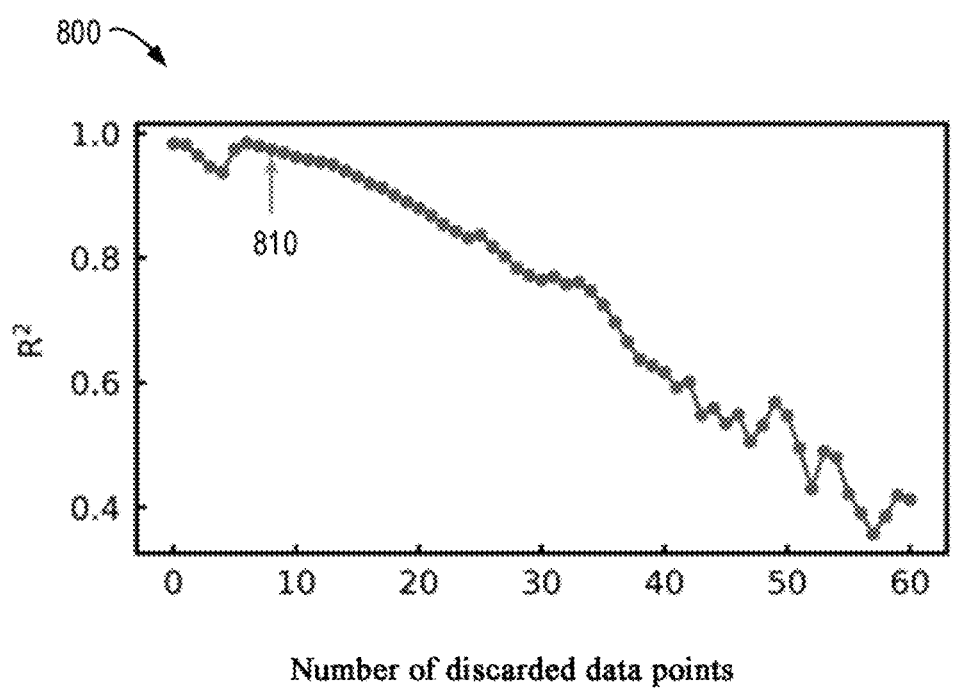

FIGS. 7-8 illustrate schematic diagrams 700 and 800 of an energy error and a fitting correlation coefficient for the number of discarded data points respectively according to exemplary embodiments of the present disclosure.

As shown in FIG. 7, it illustrates a change curve of the energy errors along with the number of discarded (also referred to as deleted) data points, where one data point may correspond to 2000 iteration rounds. It can be seen that, if the number of discarded data points is too small, the error for linear fitting is relatively large, that is, linear fitting is not facilitated.

As shown in FIG. 8, a correlation coefficient starts to decrease continuously with the number of discarded data points starting from 6. That is, when the number of discarded data points is greater than 6, the remaining data points may have better linear correlation.

Therefore, with reference to FIG. 7 and FIG. 8, in embodiments of the present disclosure, the set number of discarded data points is greater than 6, e.g., 8 (as shown in 710 in FIGS. 7 and 810 in FIG. 8), that is, when the linear relationship is determined, several results at the initial stage with multiple iteration rounds may not be considered (for example, 2000×8=16000 rounds at the initial stage). For example, as shown in FIG. 7, when the number of discarded data points is 8, extrapolation results are almost located within a fitting error (a shadow area as shown in FIG. 7) afterwards, and its own fitting error is also smaller. Therefore, it is reasonable to set the number of discarded data points to be 8.

Figure 9:
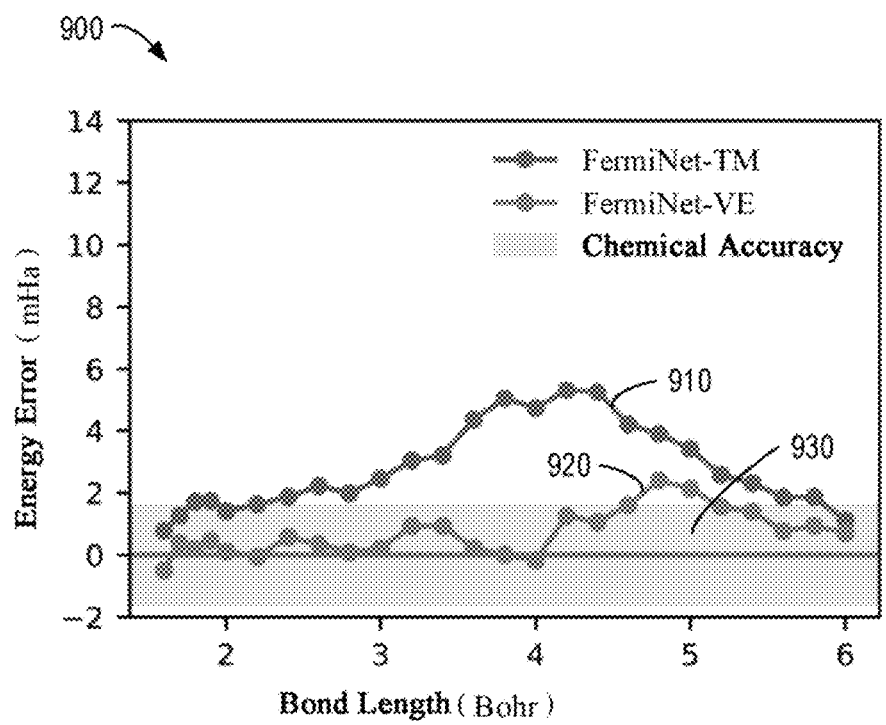
FIG. 9 illustrates a schematic diagram of an energy error curve of nitrogen molecules according to exemplary embodiments of the present disclosure.

FIG. 9 illustrates a schematic diagram of an energy error curve 900 of nitrogen molecules according to exemplary embodiments of the present disclosure. Specifically, FIG. 9 illustrates a schematic diagram of dissociation energy of nitrogen molecules obtained by using different methods. A curve 910 denotes a curve chart of an energy error as a function of bond change, which is based on the Fermionic neural network without using the variance extrapolation method of the present disclosure (FermiNet-TM). A curve 920 denotes a curve chart of an energy error as a function of bond change, which is based on the Fermionic neural network using the variance extrapolation method of the present disclosure (FermiNet-VE). As a reference, an area 930 of chemical accuracy is also shown in FIG. 9.

It can be seen that, the energy errors obtained by using the solution of the present disclosure are basically located in the area 930 of the chemical accuracy, so the accuracy of the present solution is relatively high. On the other hand, compared with the curve 910, the energy error range of the curve 920 is smaller. Specifically, the difference value between a maximum energy error value and a minimum energy error value on the curve 910 is 4.53 mHa, and the difference value between a maximum energy error value and a minimum energy error value on the curve 920 is 2.89 mHa.

Figure 10:
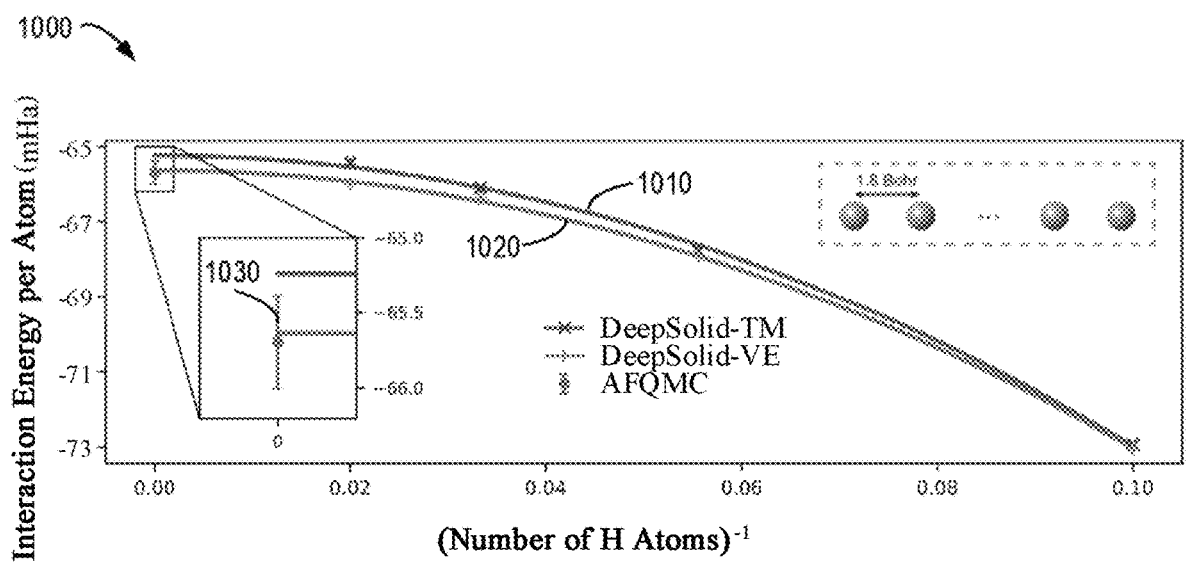
FIG. 10 illustrates a schematic diagram of an energy curve of a one-dimensional periodic hydrogen chain system according to exemplary embodiments of the present disclosure.

FIG. 10 illustrates a schematic diagram of an energy curve 1000 of a one-dimensional periodic hydrogen chain system according to exemplary embodiments of the present disclosure. Specifically, in FIG. 10, the horizontal axis denotes a reciprocal of the number of hydrogen atoms, and the vertical axis denotes the interaction energy per atom. A curve 1010 denotes a curve chart, which is based on a deep solid neural network without using the variance extrapolation method of the present disclosure (DeepSolid-TM). A curve 1020 denotes a curve chart, which is based on a deep solid neural network using the variance extrapolation method of the present disclosure (DeepSolid-VE). As a reference, FIG. 10 further illustrates a result 1030 obtained by using a high-accuracy auxiliary field quantum Monte Carlo (AFQMC) method.

As shown in FIG. 10, as the number of hydrogen atoms in the one-dimensional periodic hydrogen chain system increases, that is, from right to left in the abscissas, the energy result may gradually approach to a thermodynamic limit (corresponding to an ultimate energy result when the number of hydrogen atoms is infinite), and the curve 1020 obtained by using the solution of the present disclosure is closer to the result 1030 of the AFQMC, so that the accuracy of the present solution is higher.

Figure 11:
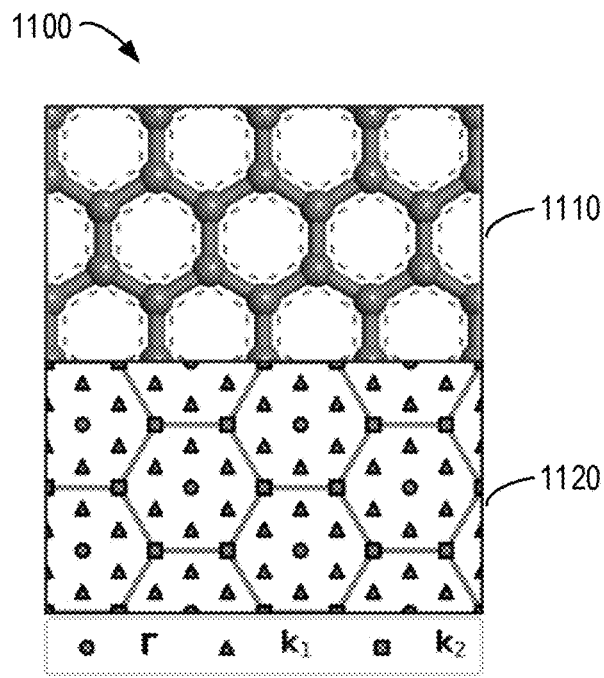
FIG. 11 illustrates a schematic diagram of a two-dimensional periodic graphene system.

FIG. 11 illustrates a schematic diagram of a two-dimensional periodic graphene system 1100. As shown in FIG. 11, it illustrates a solid spatial structure 1110 of graphene and a reciprocal vector space structure 1120, where reciprocal vectors includes r, $k_1$ and $k_2$.

Figure 12:
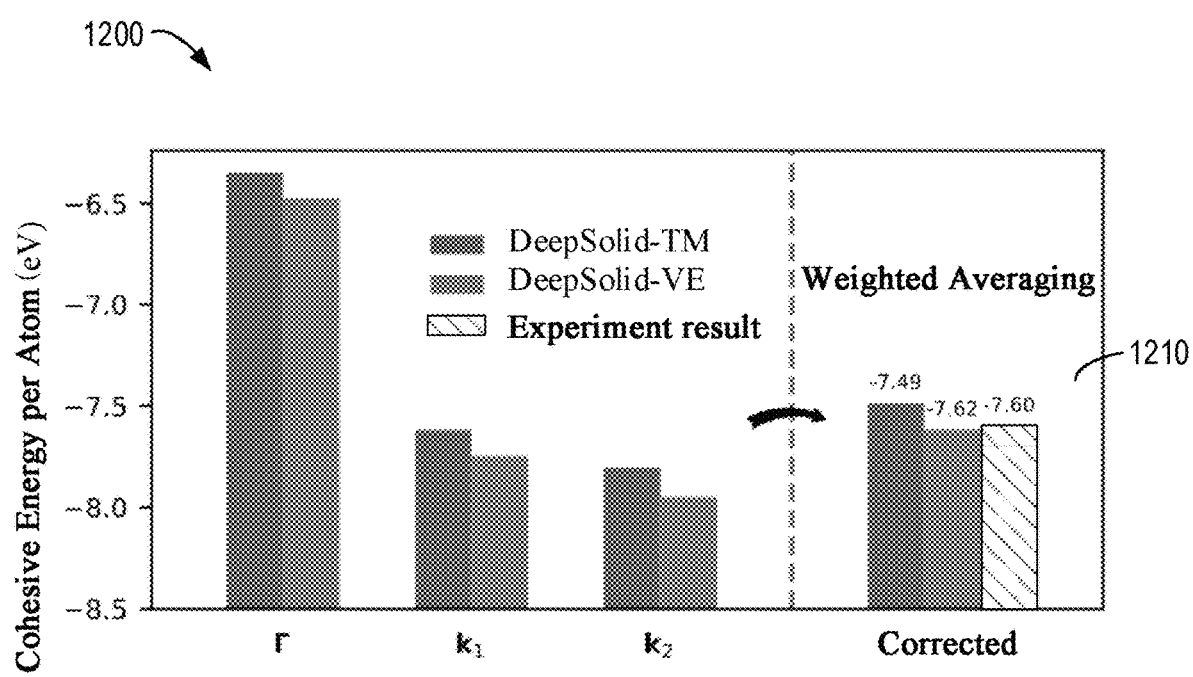
FIG. 12 illustrates a schematic diagram of an energy result obtained for the two-dimensional periodic graphene system shown in FIG. 11 according to embodiments of the present disclosure.

FIG. 12 illustrates a schematic diagram of an energy result 1200 obtained for the two-dimensional periodic graphene system shown in FIG. 11 according to embodiments of the present disclosure. Specifically, for each reciprocal vector, FIG. 12 illustrates a histogram of cohesive energy per atom, which is obtained based on the deep solid neural network without using the variance extrapolation method of the present disclosure (DeepSolid-TM), and a histogram of cohesive energy per atom, which is obtained based on the deep solid neural network using the variance extrapolation method of the present disclosure (DeepSolid-VE).

Exemplarily, in FIG. 12, weighted averaging (for example, respective weights may be determined based on the proportion of the number of reciprocal vectors shown in 1120 of FIG. 11) is further performed on the results of the reciprocal vectors, so as to obtain a corrected result 1210. As shown in FIG. 12, an averaged value of the cohesive energy per atom, which is obtained based on the deep solid neural network without using the variance extrapolation method of the present disclosure (DeepSolid-TM) is −7.49, and an averaged value of the cohesive energy per atom, which is obtained based on the deep solid neural network using the variance extrapolation method of the present disclosure (DeepSolid-VE) is −7.62.

An experiment result (−7.60) is also shown in FIG. 12 for comparison. It can be seen that, the result −7.62 obtained in the present solution is closer to the experiment result −7.60, which renders a higher accuracy of the present solution.

Figure 13:
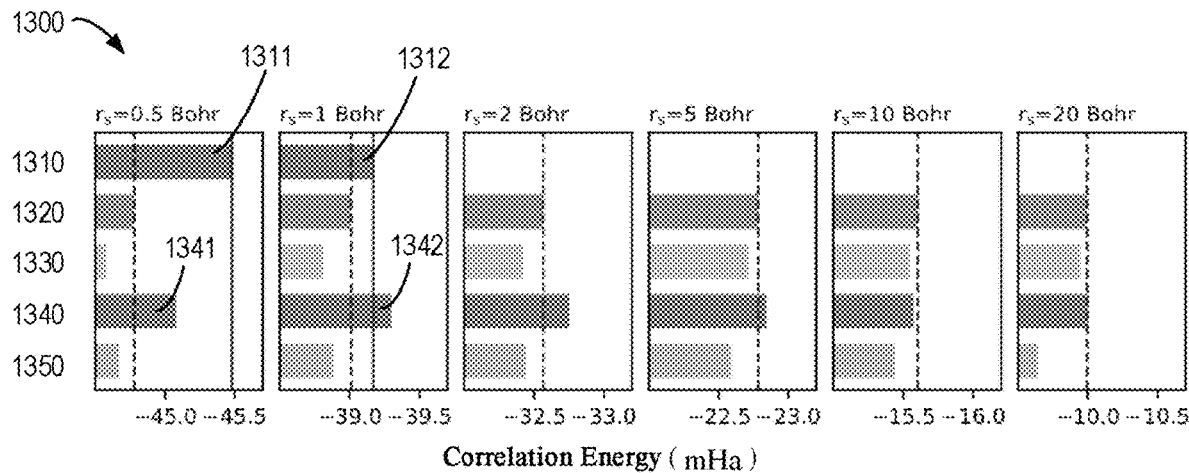
FIG. 13 illustrates a schematic diagram of an energy of a three-dimensional periodic uniform electron gas system according to exemplary embodiments of the present disclosure.

FIG. 13 illustrates a schematic diagram of energy 1300 of a three-dimensional periodic uniform electron gas system according to example embodiments of the present disclosure. Specifically, FIG. 13 illustrates TransCorrelated (TC) full configuration interaction quantum Monte Carlo (FCI-QMC) 1310, backflow (BF) diffusion Monte Carlo (DMC) 1320, BF-VMC 1330, DeepSolid-VE 1340, and DeepSolid-TM 1350.

The horizontal direction (i.e., along a length of a column) in FIG. 13 denotes correlation energy, and the correlation energy is degressive from left to right. That is, the longer the column in FIG. 13 is, the smaller the value is.

According to the comparison with the BF-DMC 1320, it can be seen that the result of the DeepSolid-TM 1350 solution is higher than the result of the BF-DMC 1320 solution, while the result of the DeepSolid-VE 1340 in the present solution is lower than the result of the BF-DMC 1320.

On the other hand, according to the comparison with the high-accuracy TC-FCIQMC 1310, it can be seen that the result obtained using the present solution is closer thereto. As shown in FIG. 13, among a plurality of results, a result 1341 of the DeepSolid-VE 1340 of the present solution is closest to a result 1311 of the high-accuracy TC-FCIQMC 1310, and a result 1342 of the DeepSolid-VE 1340 of the present solution is closest to a result 1312 of the high-accuracy TC-FCIQMC 1310. Therefore, the accuracy of the present solution is higher.

According to embodiments of the present disclosure described with reference to the drawings, based on the neural network variational Monte Carlo, the present solution may determine the relative energy of the chemical system in the training process based on the linear relationship between the energy errors and the energy variances and via the variance extrapolation method. In this way, the processing duration can be shortened, and the processing efficiency can be improved. In addition, since the ground-state wave function serving as the eigenstate should have the property that the energy variance is zero, the accuracy of the relative energy determined based on the present solution is high.

It should be understood that, in embodiments of the present disclosure, "first", "second", "third" and the like are merely intended to indicate that a plurality of objects may be different, but it is not excluded that two objects are the same, and thus should not be construed as any limitation to embodiments of the present disclosure.

It should also be understood that, the manners, cases, categories and division of the embodiments in embodiments of the present disclosure are merely for the convenience of description, and should not constitute special limitations, and various manners, categories, cases and features in the embodiments may be combined with each other in the case of meeting logic.

It should also be understood that, the above content is merely intended to help those skilled in the art better understand embodiments of the present disclosure, and is not intended to limit the scope of embodiments of the present disclosure. Those skilled in the art may make various modifications, changes or combinations and the like according to the above content. Such modified, changed or combined solutions are also within the scope of embodiments of the present disclosure.

It should also be understood that, the description of the above content focuses on emphasizing differences from various embodiments, the same or similar parts may refer to each other, and thus for brevity, details are not described herein again.

Figure 14:
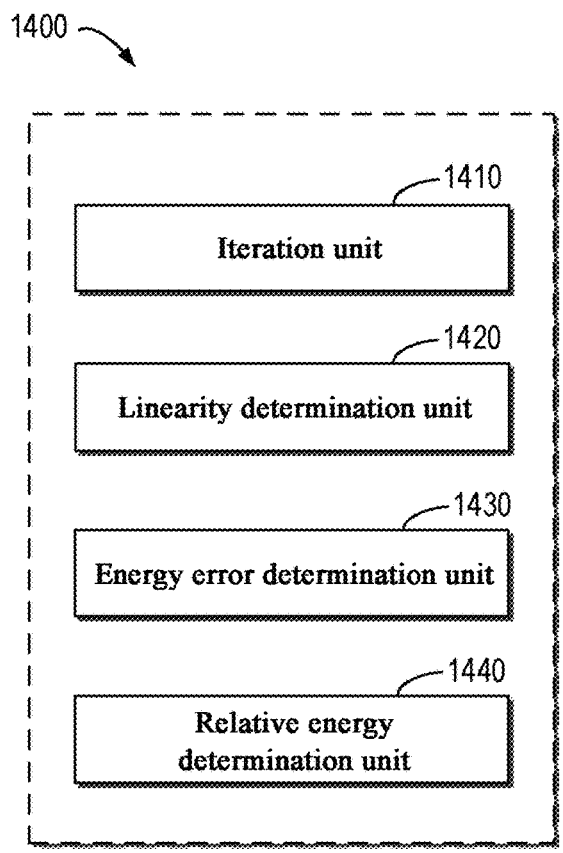
FIG. 14 illustrates a schematic block diagram of an example apparatus according to some embodiments of the present disclosure.

FIG. 14 illustrates a block diagram of an example apparatus 1400 according to some embodiments of the present disclosure. The apparatus 1400 may be implemented in software, hardware, or a combination thereof. As shown in FIG. 14, the apparatus 1400 includes an iteration unit 1410, a linearity determination unit 1420, an energy error determination unit 1430, and a relative energy determination unit 1440.

The iteration unit 1410 is configured to: for a chemical system, perform a plurality of iteration rounds using a neural network variational Monte Carlo method. The linearity determination unit 1420 is configured to acquire a linear relationship between energy errors and energy variances, which are obtained in the plurality of iteration rounds. The energy error determination unit 1430 is configured to determine a first energy error at a position where the energy variance is zero based on the linear relationship. The relative energy determination unit 1440 is configured to determine the relative energy between the chemical system and a further system based on the first energy error.

In some embodiments, the linearity determination unit 1420 is specifically configured to: determine a plurality of error-variance pairs based on the plurality of iteration rounds, where each of the plurality of error-variance pairs is determined based on N energy values obtained in every N adjacent iteration rounds, and each error-variance pair includes one energy error value and one energy variance value, and N is a positive integer; delete the first M error-variance pairs from the plurality of error-variance pairs, where M is a positive integer; and determine the linear relationship between the energy errors and the energy variances based on a plurality of remaining error-variance pairs after deleting.

Exemplarily, each error-variance pair is obtained by: for the N energy values obtained in every N adjacent iteration rounds, removing N0 anomaly values from the N energy values; determining an average energy value of the remaining N–N0 energy values after the deletion operation, where N0 is a positive integer less than N; and determining one energy error value and one energy variance value based on the average energy value.

Optionally, a difference between an anomaly value and the average energy value exceeds a threshold percentage. Optionally, N=2000, and M=8.

In some embodiments, the energy error determination unit 1430 is further configured to: determine, for the further system, a second energy error corresponding to a zero energy variance; or acquire a second energy error predetermined for the further system.

Exemplarily, the relative energy is determined based on a difference value between the first energy error and the second energy error.

In some embodiments, the iteration unit 1410 is specifically configured to: construct a wave function ansatz of the chemical system using a neural network architecture; determine, using a Monte Carlo method, the energy of the chemical system based on the wave function ansatz; determining, using a variational method, an energy gradient based on the energy; and updating the wave function ansatz and the energy through a plurality of iteration rounds.

Exemplarily, the iteration unit 1410 is configured to: in response to the chemical system being a molecular system, determine that the neural network structure is a Fermionic neural network, or in response to the chemical system being a periodic system, determine that the neural network is a deep solid neural network.

Exemplarily, the iteration unit 1410 is configured to: at a training stage, perform a plurality of iteration rounds for a first number of walkers of the chemical system; or at a detecting stage, perform a plurality of iteration rounds for a second number of walkers of the chemical system, where an order of magnitudes of the second number is greater than that of the first number.

The apparatus 1400 of FIG. 14 may be configured to implement the process described above with reference to FIG. 3, and thus for brevity, details are not described herein again.

In embodiments of the present disclosure, the division of modules or units is schematic and is merely logical function division, there may be other division manners in practical implementations; and in addition, various functional units in the disclosed embodiments may be integrated into one unit, or may exist alone physically, or two or more units may be integrated into one unit. The integrated unit may be implemented in the form of hardware, and may also be implemented in the form of a software functional unit.

Figure 15:
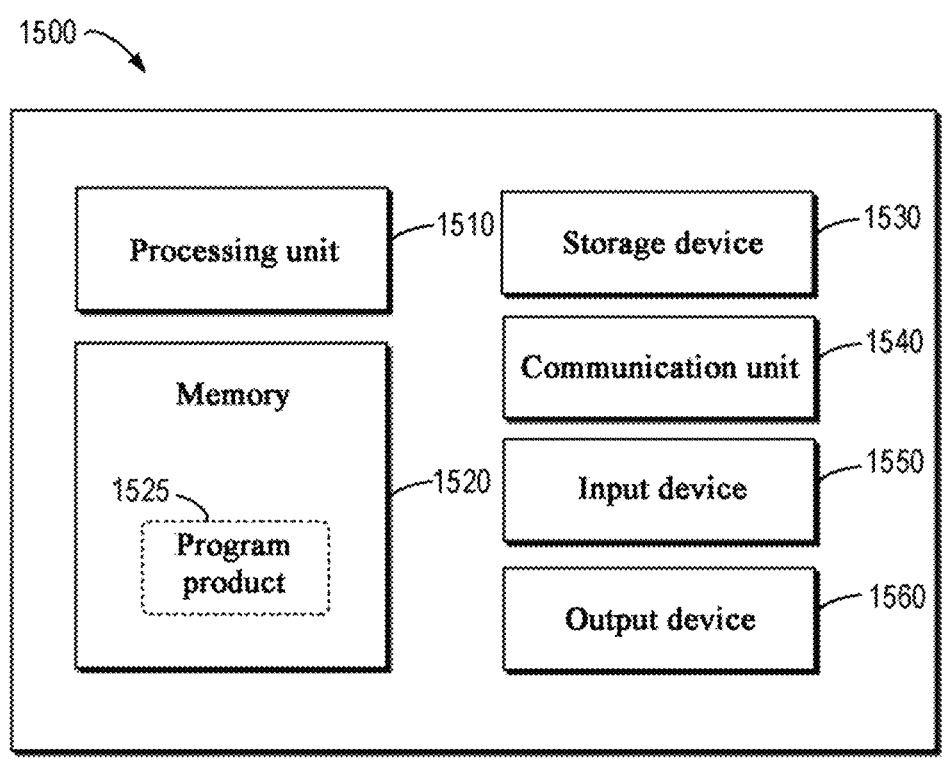
FIG. 15 illustrates a block diagram of an example device that may be used for implementing embodiments of the present disclosure.

FIG. 15 illustrates a block diagram of an example device 1500 that may be used for implementing embodiments of the present disclosure. It should be understood that the device 1500 shown in FIG. 15 is merely exemplary, and should not constitute any limitation on the functions and scopes of the implementations described herein. For example, the processes of FIG. 1 to FIG. 3 described above may be executed by using the device 1500.

As shown in FIG. 15, the device 1500 is in the form of a general-purpose computing device. Components of the computing device 1500 may include, but are not limited to, one or more processors or processing units 1510, a memory 1520, a storage device 1530, one or more communication units 1540, one or more input devices 1550, and one or more output devices 1560. The processing unit 1510 may be an actual processor or a virtual processor and may execute various processing according to programs stored in the memory 1520. In a multi-processor system, a plurality of processing units execute computer-executable instructions in parallel, so as to improve the parallel processing capability of the computing device 1500.

The computing device 1500 generally includes a plurality of computer storage media. Such media may be any available media to which the computing device 1500 may access, including, but not limited to, volatile and non-volatile media, and removable and non-removable media. The memory 1520 may be a volatile memory (e.g., a register, a high-speed cache, and a random access memory (RAM)), a non-volatile memory (e.g., a read only memory (ROM), an electrically erasable programmable read only memory (EE-PROM), and a flash memory), or some combinations thereof. The storage device 1530 may be a removable or non-removable medium, and may include a machine-readable medium, such as a flash drive, a magnetic disk, or any other media, and the storage device may be used for storing information and/or data (e.g., training data for training) and may be accessed in the computing device 1500.

The computing device 1500 may further include additional removable/non-removable, and volatile/non-volatile storage media. Although not shown in FIG. 15, a disk drive for reading or writing from a removable and non-volatile magnetic disk (e.g., a "floppy disk") and an optical disk drive for reading or writing from a removable and non-volatile optical disk may be provided. In these cases, each drive may be connected to a bus (not shown) by one or more data medium interfaces. The memory 1520 may include a computer program product 1525, which has one or more program modules, and these program modules are configured to execute various methods or actions of various implementations of the present disclosure.

The communication unit 1540 performs communication with other computing devices via a communication medium. Additionally, the functions of the components of the computing device 1500 may be implemented by a single computing cluster or a plurality of computing machines, and these computing machines may perform communication via a communication connection. Accordingly, the computing device 1500 may perform operations in a networked environment by using a logical connection with one or more other servers, a network personal computer (PC), or another network node.

The input device 1550 may be one or more input devices, such as a mouse, a keyboard, a trackball, or the like. The output device 1560 may be one or more output devices, such as a display, a speaker, a printer, or the like. The computing device 1500 may also perform communication with one or more external devices (not shown) via the communication unit 1540 as needed, the external devices, such as storage devices and display devices, perform communication with one or more devices that enable a user to interact with the computing device 1500, or perform communication with any device (e.g., a network card, a modem, and the like) that enables the computing device 1500 to perform communication with one or more other computing devices. Such communication may be executed by an input/output (I/O) interface (not shown).

According to an exemplary implementation of the present disclosure, provided is a computer-readable storage medium, storing a computer-executable instruction thereon, wherein the computer-executable instruction is executed by a processor, so as to implement the method described above. According to an exemplary implementation of the present disclosure, further provided is a computer program product, which is tangibly stored on a non-transitory computer-readable medium and includes a computer-executable instruction, wherein the computer-executable instruction is executed by a processor, so as to implement the method described above. According to an exemplary implementation of the present disclosure, provided is a computer program product, storing a computer program thereon, wherein the program, when executed by a processor, implements the method described above.

Herein, various aspects of the present disclosure are described with reference to flowcharts and/or block diagrams of methods, apparatuses, devices and computer program products implemented according to the present disclosure. It should be understood that each block of the flowcharts and/or block diagrams and combinations of the blocks in the flowcharts and/or block diagrams may be implemented by computer-readable program instructions.

These computer-readable program instructions may be provided for general-purpose computers, special-purpose computers, or processing units of other programmable data processing apparatuses, so as to produce a machine, so that when these instructions are executed by the computers or the processing units of the other programmable data processing apparatuses, an apparatus for implementing specified functions/actions in one or more blocks in the flowcharts and/or block diagrams is produced. These computer-readable program instructions may also be stored in a computer-readable storage medium, and these instructions enable the computers, the programmable data processing apparatuses and/or other devices to work in particular manners, therefore the computer-readable medium storing the instructions includes a manufacture, which includes instructions for implementing various aspects of the specified functions/actions in one or more blocks in the flowcharts and/or block diagrams.

The computer-readable program instructions may also be loaded onto the computers, the other programmable data processing apparatuses or the other devices, so as to execute a series of operation steps on the computers, the other programmable data processing apparatuses or the other devices to produce processes that are implemented by the computers, so that the instructions executed on the computers, the other programmable data processing apparatuses or the other devices implement the specified functions/actions in one or more blocks in the flowcharts and/or block diagrams.

The flowcharts and block diagrams in the drawings illustrate system architectures, functions and operations of possible implementations of systems, methods and computer program products according to a plurality of implementations of the present disclosure. In this regard, each block in the flowcharts or block diagrams may represent a part of a module, a program segment or an instruction, and a part of the module, the program segment or the instruction contains one or more executable instructions for implementing specified logical functions. In some alternative implementations, the functions annotated in the blocks may occur out of the sequence annotated in the drawings. For example, two blocks shown in succession may, in fact, be executed substantially in parallel, or the blocks may sometimes be executed in a reverse sequence, depending upon the functions involved. It should also be noted that, each block in the block diagrams and/or flowcharts, and combinations of the blocks in the block diagrams and/or flowcharts may be implemented by dedicated hardware-based systems for executing specified functions or actions, or combinations of dedicated hardware and computer instructions.

Various implementations of the present disclosure have been described above, and the above description is exemplary, not exhaustive, and is not limited to the various implementations disclosed. Many modifications and changes will be apparent to those ordinary skilled in the art without departing from the scope and spirit of the various described implementations. The terms used herein are chosen to best explain the principles of the various implementations, practical applications or improvements over technologies in the market, or to enable other ordinary skilled in the art in the art to understand the various implementations disclosed herein.

We claim:

1. A method for determining a relative energy between systems, comprising:
   for a chemical system, performing a plurality of iteration rounds using a neural network variational Monte Carlo method;
   acquiring a linear relationship between energy errors and energy variances, which are obtained in the plurality of iteration rounds;
   determining a first energy error at a position where the energy variance is zero based on the linear relationship; and
   determining the relative energy between the chemical system and a further system based on the first energy error.

2. The method of claim 1, wherein acquiring the linear relationship between energy errors and energy variances which are obtained in the plurality of iteration rounds, comprises:
   determining a plurality of error-variance pairs based on the plurality of iteration rounds, wherein each of the plurality of error-variance pairs is determined based on N energy values obtained in N adjacent iteration rounds, and each error-variance pair comprises one energy error value and one energy variance value, and N is a positive integer;
   deleting the first M error-variance pairs from the plurality of error-variance pairs, wherein M is a positive integer; and
   determining the linear relationship between energy errors and energy variances based on a plurality of remaining error-variance pairs after the deleting.

3. The method of claim 2, wherein each error-variance pair is obtained by:
   for the N energy values obtained in every N adjacent iteration rounds, removing one or multiple anomaly values from the N energy values, wherein a number of the removed one or multiple anomaly values equals to N0 being a positive integer less than N;
   determining an average energy value of the remaining N−N0 energy values after removing the one or multiple anomaly values from the N energy values; and
   determining one energy error value and one energy variance value based on the average energy value.

4. The method of claim 3, wherein a difference between an anomaly value and the average energy value exceeds a threshold percentage.

5. The method of claim 2, wherein N=2000, and M=8.

6. The method of claim 1, further comprising:
   determining, for the further system, a second energy error corresponding to a zero energy variance; or
   acquiring a second energy error predetermined for the further system.

7. The method of claim 6, wherein the relative energy is determined based on a difference value between the first energy error and the second energy error.

8. The method of claim 1, wherein for the chemical system performing the plurality of iteration rounds using the neural network variational Monte Carlo method comprises:
   constructing a wave function ansatz of the chemical system using a neural network architecture;
   determining, using a Monte Carlo method, an energy of the chemical system based on the wave function ansatz;
   determining, using a variational method, an energy gradient based on the energy; and
   updating the wave function ansatz and the energy through the plurality of iteration rounds.

9. The method of claim 8, wherein,
   in response to the chemical system being a molecular system, determining that the neural network is a Fermionic neural network, or
   in response to the chemical system being a periodic system, determining that the neural network is a deep solid neural network.

10. The method of claim 1, wherein performing the plurality of iteration rounds comprises:
    at a training stage, performing a plurality of iteration rounds for a first number of walkers of the chemical system; or
    at a detecting stage, performing a plurality of iteration rounds for a second number of walkers of the chemical system, wherein an order of magnitudes of the second number is greater than that of the first number.

11. An electronic device, comprising:
    at least one processing unit; and
    at least one memory, coupled to the at least one processing unit and storing an instruction for execution by the at least one processing unit, wherein the instruction, when executed by the at least one processing unit, causes the electronic device to execute actions comprising:
    for a chemical system, performing a plurality of iteration rounds using a neural network variational Monte Carlo method;
    acquiring a linear relationship between energy errors and energy variances, which are obtained in the plurality of iteration rounds;
    determining a first energy error at a position where the energy variance is zero based on the linear relationship; and
    determining a relative energy between the chemical system and a further system based on the first energy error.

12. The electronic device of claim 11, wherein the electronic device is caused to execute actions comprising:
    determining a plurality of error-variance pairs based on the plurality of iteration rounds, wherein each of the plurality of error-variance pairs is determined based on N energy values obtained in N adjacent iteration rounds, and each error-variance pair comprises one energy error value and one energy variance value, and N is a positive integer;
    deleting the first M error-variance pairs from the plurality of error-variance pairs, wherein M is a positive integer; and
    determining the linear relationship between energy errors and energy variances based on a plurality of remaining error-variance pairs after the deleting.

13. The electronic device of claim 12, wherein each error-variance pair is obtained by:
    for the N energy values obtained in every N adjacent iteration rounds, removing one or multiple anomaly values from the N energy values, wherein a number of the removed one or multiple anomaly values equals to N0 being a positive integer less than N:
    determining an average energy value of the remaining N−N0 energy values after removing the one or multiple anomaly values from the N energy values; and determining one energy error value and one energy variance value based on the average energy value.

14. The electronic device of claim 13, wherein a difference between an anomaly value and the average energy value exceeds a threshold percentage.

15. The electronic device of claim 11, wherein the electronic device is caused to execute actions comprising:
   determining, for the further system, a second energy error corresponding to a zero energy variance; or
   acquiring a second energy error predetermined for the further system.

16. The electronic device of claim 15, wherein the relative energy is determined based on a difference value between the first energy error and the second energy error.

17. The electronic device of claim 11, wherein the electronic device is caused to execute actions comprising:
   constructing a wave function ansatz of the chemical system using a neural network architecture;
   determining, using a Monte Carlo method, an energy of the chemical system based on the wave function ansatz;
   determining, using a variational method, an energy gradient based on the energy; and
   updating the wave function ansatz and the energy through the plurality of iteration rounds.

18. The electronic device of claim 17, wherein the electronic device is caused to execute actions comprising:
   in response to the chemical system being a molecular system, determining that the neural network is a Fermionic neural network, or
   in response to the chemical system being a periodic system, determining that the neural network is a deep solid neural network.

19. The electronic device of claim 11, wherein the electronic device is caused to execute actions comprising:
   at a training stage, performing a plurality of iteration rounds for a first number of walkers of the chemical system; or
   at a detecting stage, performing a plurality of iteration rounds for a second number of walkers of the chemical system, wherein an order of magnitudes of the second number is greater than that of the first number.

20. A non-transitory computer-readable storage medium, storing a computer program thereon, wherein the program, when executed by a processor, implements a method comprising:
   for a chemical system, performing a plurality of iteration rounds using a neural network variational Monte Carlo method;
   acquiring a linear relationship between energy errors and energy variances, which are obtained in the plurality of iteration rounds;
   determining a first energy error at a position where the energy variance is zero based on the linear relationship; and
   determining a relative energy between the chemical system and a further system based on the first energy error.

* * * * *